(12) United States Patent
Yu et al.

(10) Patent No.: US 11,807,756 B2
(45) Date of Patent: Nov. 7, 2023

(54) RESIN COMPOSITION AND ARTICLE MADE THEREFROM

(71) Applicant: Elite Material Co., Ltd., Taoyuan (TW)

(72) Inventors: Yi-Fei Yu, Taoyuan (TW); Ching-Huan Lee, Taoyuan (TW); Chen-Yu Hsieh, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 0 days.

(21) Appl. No.: 17/504,970

(22) Filed: Oct. 19, 2021

(65) Prior Publication Data

US 2023/0101478 A1   Mar. 30, 2023

(30) Foreign Application Priority Data

Jul. 28, 2021   (TW) .................... 110127744

(51) Int. Cl.
| | | |
|---|---|---|
| *C08L 79/08* | (2006.01) | |
| *C08L 71/00* | (2006.01) | |
| *C08J 5/24* | (2006.01) | |
| *B32B 15/08* | (2006.01) | |
| *B32B 15/20* | (2006.01) | |
| *H05K 1/03* | (2006.01) | |

(52) U.S. Cl.
CPC .............. *C08L 79/08* (2013.01); *B32B 15/08* (2013.01); *B32B 15/20* (2013.01); *C08J 5/244* (2021.05); *C08L 71/00* (2013.01); *H05K 1/0373* (2013.01); *B32B 2457/08* (2013.01); *C08J 2371/00* (2013.01); *C08J 2379/08* (2013.01); *C08J 2471/00* (2013.01); *C08J 2479/08* (2013.01); *C08L 2203/20* (2013.01); *C08L 2205/035* (2013.01)

(58) Field of Classification Search
None
See application file for complete search history.

(56) References Cited

U.S. PATENT DOCUMENTS

| | | | |
|---|---|---|---|
| 2006/0035107 A1* | 2/2006 | Natsuhara | C04B 35/581 |
| | | | 428/650 |
| 2016/0185904 A1* | 6/2016 | Gao | C08G 65/485 |
| | | | 524/508 |

FOREIGN PATENT DOCUMENTS

| | | | | |
|---|---|---|---|---|
| CN | 102336935 A | * | 2/2012 | .............. C08J 3/243 |

* cited by examiner

*Primary Examiner* — Tamra L. Dicus
(74) *Attorney, Agent, or Firm* — Muncy, Geissler, Olds & Lowe, P.C.

(57) ABSTRACT

A resin composition includes: (A) 100 parts by weight of a thermosetting resin, which includes a vinyl-containing polyphenylene ether resin, a maleimide resin, or a combination thereof; (B) 15 parts by weight to 50 parts by weight of a sintered body formed by aluminum nitride and boron nitride; and (C) 180 parts by weight to 280 parts by weight of titanium dioxide. Moreover, an article may be made from the resin composition, including a prepreg, a resin film, a laminate or a printed circuit board.

9 Claims, No Drawings

RESIN COMPOSITION AND ARTICLE MADE THEREFROM

CROSS-REFERENCE TO RELATED APPLICATION

This application claims the priority benefits of Taiwan Patent Application No. 110127744, filed on Jul. 28, 2021. The entirety the above-mentioned patent application is hereby incorporated by reference herein and made a part of this specification.

BACKGROUND

1. Field of the Disclosure

The present disclosure relates to a resin composition and an article made therefrom, more particularly to a resin composition useful for preparing a prepreg, a resin film, a laminate or a printed circuit board.

2. Description of Related Art

With the high integration of semiconductors and communication technology in 5G, artificial intelligence (AI) and other fields in recent years, the performance requirements for the materials of substrates with high capacitance are increasing. Traditional high dielectric property is no longer able to meet the demands for wiring boards in the semiconductor industry.

Traditional materials for antenna substrates with high capacitance contain titanium dioxide, strontium titanate or barium titanate; while they can meet the needs of materials with high capacitance, their heat dissipation performance is unfavorably low. Although thermal conductivity can be improved by adding a large amount of aluminium oxide or boron nitride, the adhesion of copper foils of the substrates will be reduced correspondingly. Moreover, with the needs of high speed and high frequency signal transmission for electronic products, an urgent need exists for the industry to provide a material with low dissipation factor, good insulation properties such as high breakdown voltage, high dielectric constant, and better thermal conductivity. Therefore, there is a need for developing materials suitable for the aforesaid substrates with high performance.

SUMMARY

In view of the shortcomings of prior arts, particularly that existing resin materials are unable to meet one or more of the above properties, the main purpose of present disclosure is to provide a resin composition which can achieve at least one excellent properties including high copper foil peeling strength, high breakdown voltage, low dissipation factor, and so on.

To achieve the above-mentioned objects, the present disclosure provides a resin composition, comprising:
- (A) 100 parts by weight of a thermosetting resin, which comprises a vinyl-containing polyphenylene ether resin, a maleimide resin, or a combination thereof;
- (B) 15 parts by weight to 50 parts by weight of a sintered body (abbreviated hereinafter as "ABN") formed by aluminum nitride and boron nitride; and
- (C) 180 parts by weight to 280 parts by weight of titanium dioxide.

For example, in one embodiment, relative to 100 parts by weight of the thermosetting resin, the resin composition further comprises 5 parts by weight to 20 parts by weight of aluminum oxide.

For example, in one embodiment, the resin composition further comprises flame retardant, crosslinking agent, curing accelerator, polymerization inhibitor, solvent, silane coupling agent, coloring agent, toughening agent, core-shell rubber, or a combination thereof.

Another main object of the present disclosure is to provide an article made from the aforesaid resin composition, comprising a prepreg, a resin film, a laminate or a printed circuit board.

For example, in one embodiment, articles made from the resin composition disclosed herein have one, more or all of the following properties:
- a copper foil peeling strength as measured by reference to IPC-TM-650 2.4.8 of greater than or equal to 4.03 lb/in;
- a breakdown voltage as measured by reference to IPC-TM-650 2.5.6.3 of greater than or equal to 35.5 kV;
- a dissipation factor as measured by reference to JIS C2565 at 10 GHz of less than or equal to 0.0049;
- a dielectric constant as measured by reference to JIS C2565 at 10 GHz of greater than or equal to 6.9; and
- a thermal conductivity as measured by reference to ASTM-D5470 of greater than or equal to 0.61 W/(m·K).

DESCRIPTION OF THE EMBODIMENTS

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

While some theories or mechanisms may be proposed herein, the present disclosure is not bound by any theories or mechanisms described regardless of whether they are right or wrong, as long as the embodiments can be implemented according to the present disclosure.

As used herein, "a," "an" or any similar expression is employed to describe components and features of the present disclosure. This is done merely for convenience and to give a general sense of the scope of the present disclosure. Accordingly, this description should be read to include one or at least one and the singular also includes the plural unless it is obvious to mean otherwise.

As used herein, "or a combination thereof" means "or any combination thereof", and "any" means "any one", vice versa.

As used herein, the term "comprises," "comprising," "includes," "including," "encompass," "encompassing," "has," "having" or any other variant thereof is construed as an open-ended transitional phrase intended to cover a non-exclusive inclusion. For example, a composition or article of manufacture that comprises a list of elements is not necessarily limited to only those elements but may include other elements not expressly listed but inherent to such composition or article of manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "encompass," "encompassing," "has," "having" or any other variant thereof, it is understood that close-ended transitional phrases such as "consisting of," "composed by" and "remainder being" and partially open-ended transitional phrases such as "consisting essentially of," "primarily consisting of," "mainly consisting of," "primarily containing," "composed essentially of," "essentially having," etc. are also disclosed and included.

In this disclosure, features and conditions such as values, numbers, contents, amounts or concentrations are presented as a numerical range or a percentage range merely for convenience and brevity. Therefore, a numerical range or a percentage range should be interpreted as encompassing and specifically disclosing all possible subranges and individual numerals or values therein, including integers and fractions, particularly all integers therein. For example, a range of "1.0 to 8.0" or "between 1.0 and 8.0" should be understood as explicitly disclosing all subranges such as 1.0 to 8.0, 1.0 to 7.0, 2.0 to 8.0, 2.0 to 6.0, 3.0 to 6.0, 4.0 to 8.0, 3.0 to 8.0 and so on and encompassing the endpoint values, particularly subranges defined by integers, as well as disclosing all individual values in the range such as 1.0, 2.0, 3.0, 4.0, 5.0, 6.0, 7.0 and 8.0. Unless otherwise defined, the aforesaid interpretation rule should be applied throughout the present disclosure regardless of broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$," it is intended to disclose the situations of X is $X_1$ and X is $X_1$ and/or $X_2$ and/or $X_3$. In addition, when a Markush group or a list of items is used to describe examples or embodiments of the present disclosure, a skilled artisan will understand that any subgroup or any combination of the members or items in the Markush group or list may also be used to describe the present disclosure. Therefore, for example, when X is described as being "selected from a group consisting of $X_1$, $X_2$ and $X_3$" and Y is described as being "selected from a group consisting of $Y_1$, $Y_2$ and $Y_3$," the disclosure shall be interpreted as any combination of X is $X_1$ or $X_2$ or $X_3$ and Y is $Y_1$ or $Y_2$ or $Y_3$.

Unless otherwise specified, according to the present disclosure, a compound refers to a chemical substance formed by two or more elements bonded with chemical bonds and may comprise a small molecule compound and a polymer compound, but not limited thereto. Any compound disclosed herein is interpreted to not only include a single chemical substance but also include a class of chemical substances having the same kind of components or having the same property.

Unless otherwise specified, according to the present disclosure, a polymer refers to the product formed by monomer(s) via polymerization and usually comprises multiple aggregates of polymers respectively formed by multiple repeated simple structure units by covalent bonds; the monomer refers to the compound forming the polymer. A polymer may comprise a homopolymer, a copolymer, a prepolymer, etc., but not limited thereto. A prepolymer refers to a chemical substance formed by two or more compounds via a polymerization reaction with a conversion rate of 10% to 90%. The term "polymer" includes but is not limited to an oligomer. An oligomer refers to a polymer with 2-20, typically 2-5, repeating units. For example, the term "diene polymer" as used herein is construed as comprising diene homopolymer, diene copolymer, diene prepolymer and diene oligomer.

Unless otherwise specified, the term "resin" is a widely used common name of a synthetic polymer and is construed in the present disclosure as comprising monomer and its combination, polymer and its combination or a combination of monomer and its polymer, but not limited thereto. For example, in the present disclosure, the term "maleimide resin" is construed to encompass a maleimide monomer, a maleimide polymer, a combination of maleimide monomers, a combination of maleimide polymers, or a combination of maleimide monomer(s) and maleimide polymer(s).

For example, in the present disclosure, the term "vinyl-containing" is construed to encompass the inclusion of a vinyl group, a vinylene group, an allyl group, a (meth) acrylate group or a combination thereof.

Unless otherwise specified, according to the present disclosure, a modification comprises a product derived from a resin with its reactive functional group modified, a product derived from a prepolymerization reaction of a resin and other resins, a product derived from a crosslinking reaction of a resin and other resins, a product derived from homopolymerizing a resin, a product derived from copolymerizing a resin and other resins, etc. For example, such as but not limited thereto, a modification may refer to replacing a hydroxyl group with a vinyl group via a chemical reaction, or obtaining a terminal hydroxyl group from a chemical reaction of a terminal vinyl group and p-aminophenol.

Unless otherwise specified, according to the present disclosure, when the term acrylate compound is expressed as (meth)acrylate, it is intended to comprise both situations of containing and not containing a methyl group; for example, cyclohexane dimethanol di(meth)acrylate is construed as including cyclohexane dimethanol diacrylate, cyclohexane dimethanol dimethacrylate or both.

It should be understood that all features disclosed herein may be combined in any way to constitute the solution of the present disclosure, as long as there is no conflict present in the combination of these features.

Unless otherwise specified, as used herein, part(s) by weight represents weight part(s) in any weight unit, such as but not limited to kilogram, gram, pound and so on. For example, 100 parts by weight of the maleimide resin may represent 100 kilograms of the maleimide resin or 100 pounds of the maleimide resin.

As used herein, D50 refers to the particle size of an inorganic filler (such as but not limited to titanium dioxide) when the cumulative volume percentage reaches 50%.

The following embodiments and examples are illustrative in nature and are not intended to limit the present disclosure and its application. In addition, the present disclosure is not bound by any theory described in the background and summary above or the following embodiments or examples. Unless otherwise specified, processes, reagents and conditions described in the examples are those known in the art.

Generally, the present disclosure provides a resin composition, comprising:
(A) 100 parts by weight of a thermosetting resin, which comprises a vinyl-containing polyphenylene ether resin, a maleimide resin, or a combination thereof;
(B) 15 parts by weight to 50 parts by weight of a sintered body formed by aluminum nitride and boron nitride; and
(C) 180 parts by weight to 280 parts by weight of titanium dioxide.

Unless otherwise specified, the vinyl-containing polyphenylene ether resin described in various embodiments may comprise various polyphenylene ether resins with terminals modified by a vinyl group, an allyl group, or a (meth) acrylate group, such as a vinylbenzyl-containing biphenyl polyphenylene ether resin, a methacrylate-containing polyphenylene ether resin, a vinylbenzyl-containing bisphenol A polyphenylene ether resin, a chain-extended vinyl-containing polyphenylene ether resin or a combination thereof, but not limited thereto.

For example, in one embodiment, the vinyl-containing polyphenylene ether resin may comprise various vinyl-containing polyphenylene ether resins known in the art to which this disclosure pertains. The vinyl-containing polyphenylene ether resin suitable for the present disclosure is not particularly limited and may comprise any one or more commercially available products, self-prepared products, or a combination thereof. In some embodiments, examples of the vinyl-containing polyphenylene ether resin include: vinylbenzyl-containing biphenyl polyphenylene ether resin (e.g., OPE-2st available from Mitsubishi Gas Chemical Co., Inc.), methacrylate-containing polyphenylene ether resin (e.g., SA9000 available from Sabic), vinylbenzyl-containing bisphenol A polyphenylene ether resin, chain-extended vinyl-containing polyphenylene ether resin or a combination thereof. The chain-extended vinyl-containing polyphenylene ether resin may include various polyphenylene ether resins disclosed in the US Patent Application Publication No. 2016/0185904 A1, all of which are incorporated herein by reference in their entirety.

For example, in one embodiment, the maleimide resin of the present disclosure comprises a monomer containing at least one maleimide group, its polymer, or a combination thereof. Unless otherwise specified, the maleimide resin used in the present disclosure is not particularly limited and may include any one or more maleimide resins useful for preparing a prepreg, a resin film, a laminate or a printed circuit board. In some embodiments, any one or more of the maleimide resins below may be used: 4,4'-diphenylmethane bismaleimide, oligomer of phenylmethane maleimide (a.k.a. polyphenylmethane maleimide), bisphenol A diphenyl ether bismaleimide, 3,3'-dimethyl-5,5'-diethyl-4,4'-diphenylmethane bismaleimide (a.k.a. bis-(3-ethyl-5-methyl-4-maleimidephenyl)methane), 3,3'-dimethyl-5,5'-dipropyl-4,4'-diphenyl methane bismaleimide, biphenyl maleimide, m-phenylene bismaleimide, 4-methyl-1,3-phenylene bismaleimide, 1,6-bismaleimide-(2,2,4-trimethyl)hexane, N-2,3-xylylmaleimide, N-2,6-xylylmaleimide, N-phenylmaleimide, diethyl bismaleimidotoluene, vinyl benzyl maleimide (VBM), vinyl cyclopentadiene-modified maleimide, maleimide resin containing aliphatic long chain structure, prepolymer of diallyl compound and maleimide resin (e.g., prepolymer of diallyl bisphenol A and 4,4'-diphenylmethane bismaleimide,), prepolymer of diamine and maleimide resin, prepolymer of multi-functional amine and maleimide resin, prepolymer of acid phenol compound and maleimide resin, or a combination thereof. Unless otherwise specified, the maleimide resins described above should be construed as including the modifications thereof.

For example, examples of the maleimide resin may include products such as BMI-1000, BMI-1000H, BMI-1100, BMI-1100H, BMI-2000, BMI-2300, BMI-3000, BMI-3000H, BMI-4000, BMI-5000, BMI-5100, BMI-TMH, BMI-7000 and BMI-7000H available from Daiwakasci Industry, products such as BMI-70 and BMI-80 available from K.I Chemical Industry Co., Ltd., products such as MIR-3000 available from Nippon Kayaku, products such as DE-TDAB available from Evonik Industries, products such as Homide801 available from HOS-Technik, or products such as 5G 001 s available from Shin-Etsu Chemical Co., Ltd.

For example, the maleimide resin containing aliphatic long chain structure may include products such as BMI-689, BMI-1400, BMI-1500, BMI-1700, BMI-2500, BMI-3000, BMI-5000 and BMI-6000 available from Designer Molecules Inc. For example, the maleimide resin containing aliphatic long chain structure may have at least one maleimide group bonded with a substituted or unsubstituted long-chain aliphatic group. The long-chain aliphatic group may be a $C_5$ to $C_{50}$ aliphatic group, such as $C_{10}$ to $C_{50}$, $C_{20}$ to $C_{50}$, $C_{30}$ to $C_{50}$, $C_{20}$ to $C_{40}$, or $C_{30}$ to $C_{40}$, but not limited thereto. Examples of commercial maleimide resins containing aliphatic long-chain structure include:

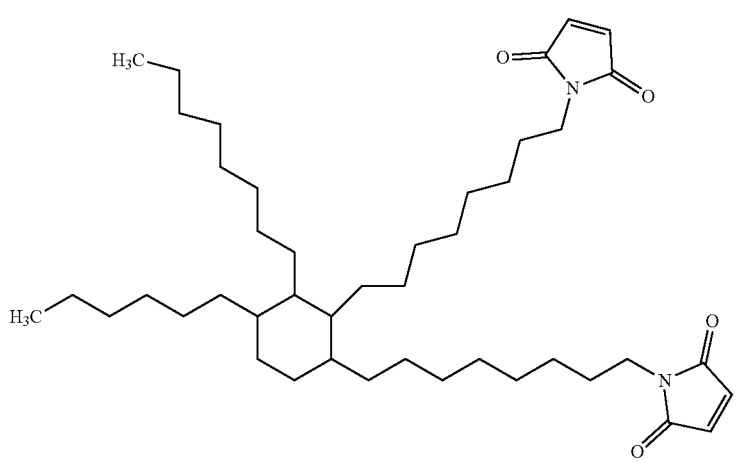

BMI-689

-continued
BMI-1400
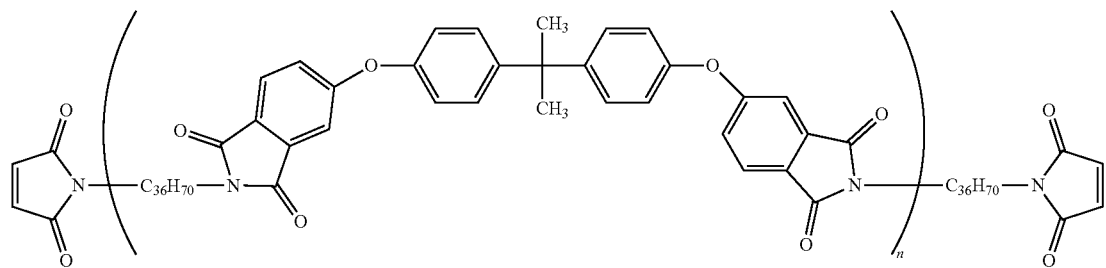
Where n = 1 to 10
BMI-1500
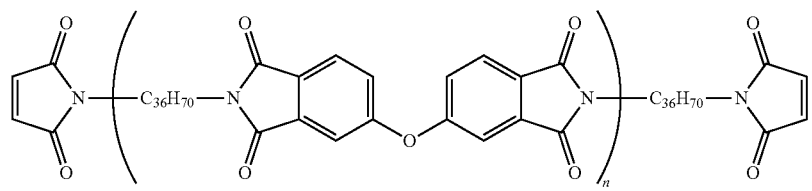
Average n = 1.3
BMI-1700
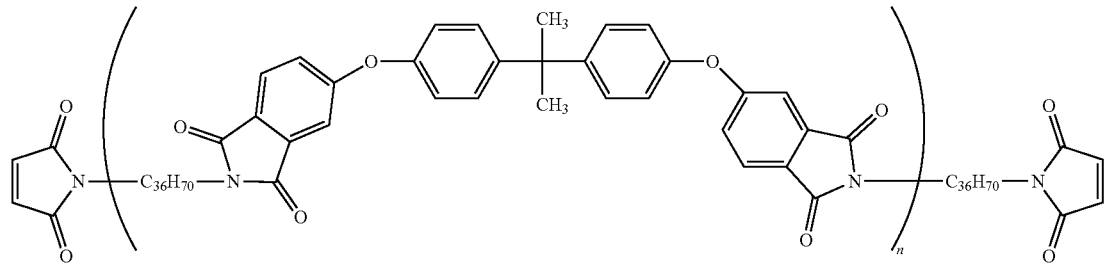
Where n = 1 to 10
BMI-2500
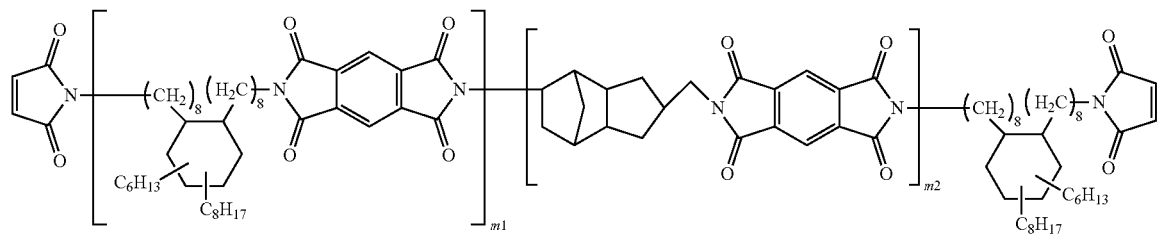
m1 = 3 (average); m2 = 3 (average)

-continued

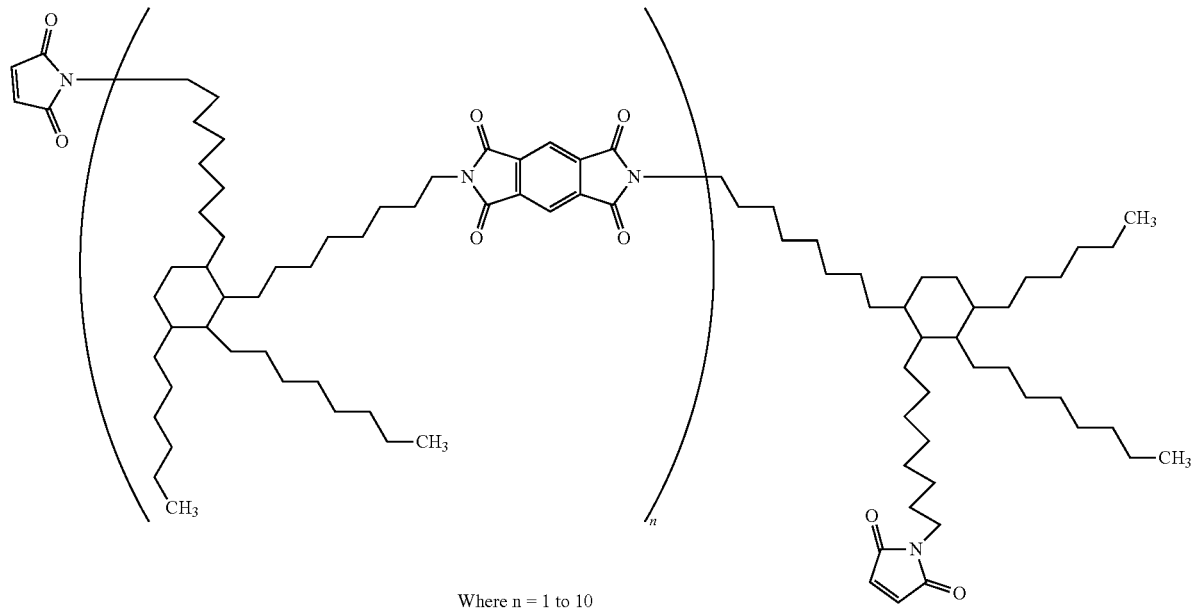

Where n = 1 to 10

BMI-3000, BMI-5000, BMI-6000

The sintered body formed by aluminum nitride and boron nitride may be prepared according to processes and conditions as known in the art to which this disclosure pertains. For example, in one embodiment, the sintered body formed by aluminum nitride and boron nitride is prepared from aluminum nitride and boron nitride in a weight ratio of 4:1 to 16:1, mixed with sintering aid such as calcium carbonate, sodium carbonate, boric acid or the like, and formed using metal molds, cold isostatic pressing (CIP) or other known processes, followed by sintering at a temperature of 1,500° C. to 2,200° C. in a non-oxidative gas atmosphere of nitrogen, argon or the like for 1 to 30 hours, so as to obtain the sintered body formed by aluminum nitride and boron nitride. Preferably, the sintered body is formed from aluminum nitride and boron nitride in a weight ratio of 6:1 to 14:1.

Unless otherwise specified, the particle size distribution (D50) of the sintered body formed by aluminum nitride and boron nitride may be ≤30 µm, preferably 5 µm≤D50≤25 µm, but not limited thereto.

Unless otherwise specified, the titanium dioxide used in the resin composition of the present disclosure is not particularly limited and may include various titanium dioxides useful for preparing a prepreg, a resin film, a laminate or a printed circuit board.

Unless otherwise specified, the particle size distribution (D50) of the titanium dioxide may be 0.5 µm≤D50≤5 µm, but not limited thereto.

In addition to the aforesaid thermosetting resin, sintered body formed by aluminum nitride and boron nitride and titanium dioxide, the resin composition disclosed herein may further optionally comprise other components.

For example, in one embodiment, the resin composition disclosed herein may further optionally comprise aluminium oxide, such as 5 parts by weight to 20 parts by weight of aluminium oxide relative to 100 parts by weight of the thermosetting resin.

Unless otherwise specified, the particle size distribution (D50) of the aluminium oxide may be 0.5 µm≤D50≤10 µm, but not limited thereto.

For example, in one embodiment, the resin composition disclosed herein may optionally further comprise flame retardant, crosslinking agent, curing accelerator, polymerization inhibitor, solvent, silane coupling agent, coloring agent, toughening agent, core-shell rubber, or a combination thereof. For example, in one embodiment, the content of any one of the aforesaid components, relative to 100 parts by weight of the thermosetting resin, may range from 0.01 part by weight to 300 parts by weight, such as but not limited to 0.01 part by weight to 3 parts by weight, 30 parts by weight to 80 parts by weight or 50 parts by weight to 300 parts by weight.

Unless otherwise specified, the flame retardant suitable for the present disclosure may be any one or more flame retardants suitable for preparing a prepreg, a resin film, a laminate or a printed circuit board; examples include but are not limited to phosphorus-containing flame retardants, preferably including ammonium polyphosphate, hydroquinone bis(diphenyl phosphate), bisphenol A bis(diphenylphosphate), tri(2-carboxyethyl)phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, 9,10-dihydro-9-oxa-10-phospha-phenanthrene-10-oxide (DOPO) and its derivatives (such as a di-DOPO compound) or resins, diphenylphosphine oxide (DPPO) and its derivatives (such as a di-DPPO compound) or resins, melamine cyanurate, tri-hydroxyethyl isocyanurate, aluminium phosphinate (e.g., commercially available OP-930 and OP-935), or a combination thereof. Unless otherwise specified, the amount of the aforesaid flame retardant is not particularly limited.

For example, the flame retardant may be a DPPO compound (e.g., di-DPPO compound), a DOPO compound (e.g., di-DOPO compound), a DOPO resin (e.g., DOPO-HQ, DOPO-NQ, DOPO-PN, and DOPO-BPN), and a DOPO-containing epoxy resin, wherein DOPO-PN is a DOPO-containing phenol novolac resin, and DOPO-BPN may be a DOPO-containing bisphenol novolac resin, such as DOPO-BPAN (DOPO-bisphenol A novolac), DOPO-BPFN (DOPO-bisphenol F novolac) and DOPO-BPSN (DOPO-bisphenol S novolac). Unless otherwise specified, the amount of the aforesaid flame retardant is not particularly limited.

For example, in one embodiment, the crosslinking agent suitable for the present disclosure may be various crosslinking agents for a resin composition known in the field to which this disclosure pertains, including but not limited to triallyl isocyanurate, polyolefin or a combination thereof. For example, relative to 100 parts by weight of the thermosetting resin, in the resin composition disclosed herein, the amount of the crosslinking agent is not particularly limited and may preferably range from 50 parts by weight to 70 parts by weight.

Unless otherwise specified, the amount of the curing accelerator used herein may be adjusted according to the need. For example, relative to 100 parts by weight of the thermosetting resin, in the resin composition disclosed herein, the amount of the curing accelerator is not particularly limited and may range from 0.1 part by weight to 15 parts by weight, such as 0.1 part by weight to 0.5 part by weight or 1 part by weight to 10 parts by weight.

For example, the curing accelerator (including curing initiator) may comprise a catalyst, such as a Lewis base or a Lewis acid. The Lewis base may comprise imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethylaminopyridine (DMAP) or a combination thereof. The Lewis acid may comprise metal salt compounds, such as those of manganese, iron, cobalt, nickel, copper and zinc, such as zinc octanoate or cobalt octanoate. The curing accelerator also includes a curing initiator, such as a peroxide capable of producing free radicals, examples of curing initiator including but not limited to dicumyl peroxide, tert-butyl peroxybenzoate, dibenzoyl peroxide (BPO), 2,5-dimethyl-2,5-di (tert-butylperoxy)-3-hexyne (25B), bis(tert-butylperoxyisopropyl) benzene or a combination thereof.

The polymerization inhibitor suitable for the present disclosure may inhibit the polymerization reaction. Unless otherwise specified, examples thereof are not particularly limited, which may include various molecule type polymerization inhibitors, stable free radical type polymerization inhibitors or a combination thereof known in the field to which this disclosure pertains. For example, molecule type polymerization inhibitors suitable for the present disclosure include but are not limited to phenols, quinones, arylamines, arene nitro compounds, sulfur-containing compounds, chlorides of metal with variable valency or a combination thereof. More specifically, molecule type polymerization inhibitors suitable for the present disclosure include but are not limited to phenol, hydroquinone, 4-tert-butylcatechol, benzoquinone, chloroquinone, 1,4-naphthoquinone, trimethylquinone, aniline, nitrobenzene, $Na_2S$, $FeCl_3$, $CuCl_2$ or a combination thereof. For example, stable free radical type polymerization inhibitors suitable for the present disclosure include but are not limited to 1,1-diphenyl-2-picrylhydrazyl radical (DPPH), triphenylmethyl radical or a combination thereof.

The purpose of adding solvent according to the present disclosure is to dissolve the components in the resin composition so as to change the solid content of the resin composition and to adjust the viscosity of the resin composition. For example, the solvent may comprise, but not limited to, methanol, ethanol, ethylene glycol monomethyl ether, acetone, butanone (i.e., methyl ethyl ketone), methyl isobutyl ketone, cyclohexanone, toluene, xylene, methoxyethyl acetate, ethoxyethyl acetate, propoxyethyl acetate, ethyl acetate, propylene glycol methyl ether, dimethyl formamide, dimethyl acetamide, N-methyl-pyrrolidone, or a mixture thereof. The amount of solvent is not particularly limited and may be adjusted according to the viscosity required for the resin composition.

Unless otherwise specified, silane coupling agent suitable for the present disclosure may comprise silane (such as but not limited to siloxane), which may be further categorized according to the functional groups into amino silane, epoxide silane, vinyl silane, ester silane, hydroxyl silane, isocyanate silane, methacryloxy silane and acryloxy silane. The amount of silane coupling agent is not particularly limited and may be adjusted according to the dispersivity of inorganic filler used in the resin composition.

Unless otherwise specified, the coloring agent suitable for the present disclosure may comprise, but not limited to, dye or pigment.

The purpose of toughening agent used herein is to improve the toughness of the resin composition. Unless otherwise specified, the toughening agent suitable for the present disclosure may comprise, but not limited to, carboxyl-terminated butadiene acrylonitrile rubber (CTBN rubber).

The resin compositions of various embodiments of the present disclosure may be processed by various methods to fabricate different articles, including but not limited to a prepreg, a resin film, a laminate or a printed circuit board.

For example, the resin compositions of various embodiments may be used to make prepregs.

For example, in one embodiment, the prepreg disclosed herein has a reinforcement material and a layered structure formed thereon, wherein the layered structure is made by heating the resin composition at high temperature to a semi-cured state (B-stage). Suitable baking temperature for making the prepreg may be for example 130° C. to 170° C. The reinforcement material may be a fiber material or a non-fiber material, configured as any one of woven fabric and non-woven fabric, and the woven fabric preferably comprises fiberglass fabrics. Types of fiberglass fabrics are not particularly limited and may be any commercial fiberglass fabric useful for various printed circuit boards, such as E-glass fiber fabric, D-glass fiber fabric, S-glass fiber fabric, T-glass fiber fabric, L-glass fiber fabric or Q-glass fiber fabric, wherein the fiber may comprise yarns and rovings, in spread form or standard form. Non-woven fabric preferably comprises liquid crystal polymer non-woven fabric, such as polyester non-woven fabric, polyurethane non-woven fabric and so on, but not limited thereto. Woven fabric may also comprise liquid crystal polymer woven fabric, such as polyester woven fabric, polyurethane woven fabric and so on, but not limited thereto. The reinforcement material may increase the mechanical strength of the prepreg. In one preferred embodiment, the reinforcement material can be optionally pre-treated by a silane coupling agent. The prepreg may be further heated and cured to the C-stage to form an insulation layer.

For example, in one embodiment, by well mixing the resin composition to form a varnish, loading the varnish into an impregnation tank, impregnating a fiberglass fabric into the impregnation tank to adhere the resin composition onto the fiberglass fabric, and finally heating and baking the resin composition at a proper temperature to a semi-cured state, a prepreg may be obtained.

For example, the article made from the resin composition disclosed herein may be a resin film.

For example, in one embodiment, the resin film disclosed herein is prepared by heating and baking the resin composition to the semi-cured state. For example, by selectively coating the resin composition on a liquid crystal polymer film, a polyethylene terephthalate film (PET film) or a polyimide film, followed by heating and baking at a proper temperature to a semi-cured state, a resin film may be obtained. For example, the resin composition from each embodiment may be coated on a copper foil to uniformly adhere the resin composition thereon, followed by heating and baking at a proper temperature to a semi-cured state to obtain the resin film.

For example, the resin compositions of various embodiments may be used to make laminates.

For example, in one embodiment, the laminate of the present disclosure comprises at least two metal foils and at least one insulation layer disposed between the metal foils, wherein the insulation layer may be formed by curing the resin composition at high temperature and high pressure to the C-stage, a suitable curing temperature being for example between 190° C. and 210° C. and preferably between 195° C. and 205° C., a suitable curing time being 90 to 120 minutes and preferably 100 to 110 minutes, and a suitable pressure being for example between 30 kg/cm$^2$ and 40 kg/cm$^2$ and preferably 35 kg/cm$^2$. The insulation layer may be obtained by curing the aforesaid prepreg or resin film. The metal foil may contain copper, aluminum, nickel, platinum, silver, gold or alloy thereof, such as a copper foil. In a preferred embodiment, the laminate is a copper-clad laminate.

For example, in one embodiment, the laminate may be further processed by trace formation processes to provide a printed circuit board.

For example, in one embodiment of making a printed circuit board disclosed herein, a double-sided copper-clad laminate (such as product EM-891, available from Elite Material Co., Ltd.) with a thickness of 28 mil and having 0.5 ounce (oz) HVLP (hyper very low profile) copper foils may be used, which is subject to drilling and then electroplating, so as to form electrical conduction between the top layer copper foil and the bottom layer copper foil. Then the top layer copper foil and the bottom layer copper foil are etched to form inner layer circuits. Then brown oxidation and roughening are performed on the inner layer circuits to form uneven structures on the surface to increase roughness. Next, a vacuum lamination apparatus is used to laminate the assembly of a copper foil, the prepreg, the inner layer circuit, the prepreg and a copper foil stacked in said order by heating at 190° C. to 210° C. for 90 to 120 minutes to cure the insulation material of the prepregs. Next, black oxidation, drilling, copper plating and other known circuit board processes are performed on the outmost copper foils so as to obtain the printed circuit board.

In one embodiment, the resin composition disclosed herein may achieve improvement in one or more of the following properties of the article: copper foil peeling strength, breakdown voltage, dissipation factor, dielectric constant, and thermal conductivity.

For example, articles made from the resin compositions according to the present disclosure may achieve one, more or all of the following properties:

a copper foil peeling strength as measured by reference to IPC-TM-650 2.4.8 of greater than or equal to 4.03 lb/in, such as greater than or equal to 4.11 lb/in, or such as between 4.03 lb/in and 4.33 lb/in;

a breakdown voltage as measured by reference to IPC-TM-650 2.5.6.3 of greater than or equal to 35.5 kV, such as greater than or equal to 41.0 kV, or such as between 35.5 kV and 43.0 kV;

a dissipation factor as measured by reference to JIS C2565 at 10 GHz of less than or equal to 0.0049, such as less than or equal to 0.0043, or such as between 0.0039 and 0.0049;

a dielectric constant as measured by reference to JIS C2565 at 10 GHz of greater than or equal to 6.9, such as greater than or equal to 7.1, or such as between 6.9 and 7.9; and a thermal conductivity as measured by reference to ASTM-D5470 of greater than or equal to 0.61 W/(m·K), such as greater than or equal to 0.66 W/(m·K), or such as between 0.61 W/(m·K) and 0.74 W/(m·K).

Raw materials below were used to prepare the resin compositions of various Examples and Comparative Examples of the present disclosure according to the amount listed in Table 1 to Table 4 and further fabricated to prepare test samples.

Materials and reagents used in Examples and Comparative Examples disclosed herein are listed below:

SA9000: methacrylate-containing polyphenylene ether resin, available from Sabic.

OPE-2st(1200): vinylbenzyl-containing biphenyl polyphenylene ether resin, available from Mitsubishi Gas Chemical Co., Inc.

OPE-2st(2200): vinylbenzyl-containing biphenyl polyphenylene ether resin, available from Mitsubishi Gas Chemical Co., Inc.

DE-TDAB: diethyl bismaleimidotoluene, available from Evonik Industries.

BMI-1000: 4,4'-diphenylmethane bismaleimide, available from Daiwa Fine Chemicals Co., Ltd.

MIR-3000: biphenyl maleimide, available from Nippon Kayaku.

BMI-70: bis(3-ethyl-5-methyl-4-maleimidephenyl) methane, available from K.I Chemical Industry Co., Ltd.

BMI-2300: polyphenylmethane maleimide, available from Daiwa Fine Chemicals Co., Ltd.

BMI-1500: maleimide resin containing aliphatic long-chain structure, available from Designer Molecules Inc.

BMI-1700: maleimide resin containing aliphatic long-chain structure, available from Designer Molecules Inc.

BMI-3000: maleimide resin containing aliphatic long-chain structure, available from Designer Molecules Inc.

BMI-80: bisphenol A diphenyl ether bismaleimide, available from K.I Chemical Industry Co., Ltd.

Homide801: prepolymer of 4,4'-diphenylmethanebismaleimide and diallylbisphenol A, available from HOS-Technik.

5G 001 s: vinyl cyclopentadiene-modified maleimide, available from Shin-Etsu Chemical Co., Ltd.

TAIC: triallyl isocyanurate, commercially available.

Ricon 100: butadiene-styrene copolymer, available from Cray Valley.

ABN-020: sintered body formed by aluminum nitride and boron nitride in a weight ratio of 6:1 to 14:1 and having a particle size distribution (D50) of 5 μm≤D50≤25 μm, available from Vast Applied Material Technology Corporation.

AlN: aluminum nitride, product name AlN-010S, available from Vast Applied Material Technology Corporation.

BN: boron nitride, product name CFP007ST, available from 3M.

TiO$_2$: titanium dioxide, product name HT0210, available from Prior Company Limited.

SrTiO$_3$: strontium titanate, available from Prosperity Dielectrics Co., Ltd.

BaTiO$_3$: barium titanate, available from Prosperity Dielectrics Co., Ltd.

Al$_2$O$_3$: aluminium oxide, available from Vast Applied Material Technology Corporation.

25B: 2,5-dimethyl-2,5-di(tert-butylperoxy)-3-hexyne, available from NOF Corporation.

Solvent mixture: mixture of methyl ethyl ketone (MEK) and toluene in a ratio of 1:1, prepared by Applicant.

Compositions and test results of resin compositions of Examples and Comparative Examples are listed below (in part by weight):

TABLE 1

Resin compositions of Examples (in part by weight) and test results

| Component | Name | E1 | E2 | E3 | E4 | E5 | E6 | E7 | E8 |
|---|---|---|---|---|---|---|---|---|---|
| vinyl-containing polyphenylene ether resin | SA9000 | 100 | 100 | 100 | 100 | 100 | 35 | | |
| | OPE-2s(1200) | | | | | | 35 | | |
| | OPE-2st(2200) | | | | | | 30 | | |
| maleimide resin | DE-TDAB | | | | | | | | 20 |
| | BMI-1000 | | | | | | | | 20 |
| | MIR-3000 | | | | | | | | 20 |
| | BMI-70 | | | | | | | 100 | |
| | BMI-2300 | | | | | | | | 20 |
| | BMI-1500 | | | | | | | | |
| | BMI-1700 | | | | | | | | |
| | BMI-3000 | | | | | | | | |
| | BMI-80 | | | | | | | | 20 |
| | Homide801 | | | | | | | | |
| | 5G 001s | | | | | | | | |
| first filler | ABN-020 | 20 | 15 | 50 | 20 | 20 | 20 | 20 | 20 |
| | AlN | | | | | | | | |
| | BN | | | | | | | | |
| second filler | TiO$_2$ | 220 | 220 | 220 | 180 | 280 | 220 | 220 | 220 |
| | SrTiO$_3$ | | | | | | | | |
| | BaTiO$_3$ | | | | | | | | |
| other filler | Al$_2$O$_3$ | | | | | | | | |
| crosslinking agent | TAIC | 40 | 40 | 40 | 40 | 40 | 35 | 40 | 40 |
| | Ricon 100 | 20 | 20 | 20 | 20 | 20 | 15 | 20 | 20 |
| curing-accelerator | 25B | 1 | 1 | 1 | 1 | 1 | 1 | 1 | 1 |
| solvent mixture | MEK: toluene = 1:1 | 90 | 90 | 90 | 90 | 90 | 90 | 90 | 90 |

| Property | Unit | E1 | E2 | E3 | E4 | E5 | E6 | E7 | E8 |
|---|---|---|---|---|---|---|---|---|---|
| copper foil peeling strength | lb/in | 4.23 | 4.14 | 4.08 | 4.33 | 4.13 | 4.29 | 4.11 | 4.15 |
| breakdown voltage | kV | 40.0 | 36.0 | 42.0 | 35.5 | 43.0 | 36.0 | 41.0 | 41.0 |
| dissipation factor | — | 0.0041 | 0.0043 | 0.0041 | 0.0043 | 0.0045 | 0.0042 | 0.0047 | 0.0048 |
| dielectric constant | — | 7.1 | 7.1 | 6.9 | 7.0 | 7.9 | 7.1 | 7.1 | 7.0 |
| thermal conductivity | W/(m · K) | 0.63 | 0.66 | 0.74 | 0.65 | 0.68 | 0.63 | 0.66 | 0.62 |

TABLE 2

Resin compositions of Examples (in part by weight) and test results

| Component | Name | E9 | E10 | E11 | E12 | E13 | E14 | E15 | E16 |
|---|---|---|---|---|---|---|---|---|---|
| vinyl-containing polyphenylene ether resin | SA9000 | | | | 20 | 100 | 100 | 100 | |
| | OPE-2st(1200) | | | | 25 | | | | |
| | OPE-2sl(2200) | | | | 25 | | | | |
| maleimide resin | DE-TDAB | | 5 | | | | | | |
| | BMI-1000 | | 25 | | | | | | |
| | MIR-3000 | | | | 20 | | | | |
| | BMI-70 | | | | | | | | |
| | BMI-2300 | | | | | | | | |
| | BMI-1500 | 35 | 25 | | | | | | |
| | BMI-1700 | 35 | 25 | | | | | | |
| | BMI-3000 | 34 | | | | | | | |
| | BMI-80 | | | | 10 | | | | |
| | Homide801 | | | 50 | | | | | 60 |
| | 5G 001s | | | 50 | | | | | 40 |

TABLE 2-continued

Resin compositions of Examples (in part by weight) and test results

| | | | | | | | | | |
|---|---|---|---|---|---|---|---|---|---|
| first filler | AB-020 | 20 | 20 | 20 | 40 | 20 | 20 | 20 | 20 |
| | AlN | | | | | | | | |
| | BN | | | | | | | | |
| second filler | TiO$_2$ | 220 | 220 | 220 | 280 | 220 | 220 | 220 | 220 |
| | SrTiO$_3$ | | | | | | | | |
| | BaTiO$_3$ | | | | | | | | |
| other filler | Al$_2$O$_3$ | | | | | 10 | 5 | 20 | |
| crosslinking agent | TAIC | 40 | 40 | 40 | 50 | 40 | 40 | 40 | |
| | Ricon 100 | 10 | 20 | 20 | 20 | 20 | 20 | 20 | |
| curing-accelerator | 25B | 1 | 1 | 1 | 0.5 | 1 | 1 | 1 | 1 |
| solvent mixture | MEK: toluene = 1:1 | 90 | 90 | 90 | 100 | 90 | 90 | 90 | 90 |
| Property | Unit | E9 | E10 | E11 | E12 | E13 | E14 | E15 | E16 |
| copper foil peeling strength | lb/in | 4.19 | 4.11 | 4.03 | 4.24 | 4.23 | 4.23 | 4.23 | 4.03 |
| breakdown voltage | kV | 41.0 | 41.0 | 43.0 | 42.0 | 41.0 | 40.5 | 43.0 | 43.0 |
| dissipation factor | — | 0.0043 | 0.0041 | 0.0049 | 0.0039 | 0.0043 | 0.0044 | 0.0043 | 0.0049 |
| dielectric constant | — | 7.0 | 7.0 | 7.1 | 7.5 | 7.2 | 7.1 | 7.6 | 7.1 |
| thermal conductivity | W/(m · K) | 0.61 | 0.67 | 0.67 | 0.69 | 0.66 | 0.67 | 0.69 | 0.67 |

TABLE 3

Resin compositions of Comparative Examples (in part by weight) results

| Component | Name | C1 | C2 | C3 | C4 | C5 | C6 |
|---|---|---|---|---|---|---|---|
| vinyl-containing polyphenylene ether resin | SA9000 | 100 | 100 | 100 | 100 | 100 | 100 |
| | OPE-2st(1200) | | | | | | |
| | OPE-2st(2200) | | | | | | |
| maleimide resin | DE-TDAB | | | | | | |
| | BMI-1000 | | | | | | |
| | MIR-3000 | | | | | | |
| | BMI-70 | | | | | | |
| | BMI-2300 | | | | | | |
| | BMI-1500 | | | | | | |
| | BMI-1700 | | | | | | |
| | BMI-3000 | | | | | | |
| | BMI-80 | | | | | | |
| | Homide801 | | | | | | |
| | 5G 001s | | | | | | |
| first filler | ABN-020 | | | | 20 | 20 | 10 | 70 |
| | AlN | 10 | | | | | |
| | BN | 10 | | | | | |
| second filler | TiO$_2$ | 220 | 220 | | | 220 | 220 |
| | SrTiO$_3$ | | | 220 | | | |
| | BaTiO$_3$ | | | | 220 | | |
| other filler | Al$_2$O$_3$ | | | | | | |
| crosslinking agent | TAIC | 40 | 40 | 40 | 40 | 40 | 40 |
| | Ricon 100 | 20 | 20 | 20 | 20 | 20 | 20 |
| curing accelerator | 25B | 1 | 1 | 1 | 1 | 1 | 1 |
| solvent mixture | MEK:toluene = 1:1 | 90 | 90 | 90 | 90 | 90 | 90 |
| Property | Unit | C1 | C2 | C3 | C4 | C5 | C6 |
| copper foil peeling strength | lb/in | 3.69 | 4.45 | 3.49 | 3.51 | 3.89 | 3.34 |
| breakdown voltage | kV | 28.0 | 25.0 | 30.0 | 30.5 | 35.0 | 45.0 |
| dissipation factor | — | 0.0053 | 0.0047 | 0.0115 | 0.0155 | 0.0049 | 0.0051 |
| dielectric constant | — | 6.9 | 7.1 | 8.5 | 8.2 | 7.0 | 6.6 |
| thermal conductivity | W/(m · K) | 0.68 | 0.61 | 0.60 | 0.60 | 0.61 | 0.92 |

TABLE 4

Resin compositions of Comparative Examples (in part by weight) results

| Component | Name | C7 | C8 | C9 | C10 | C11 |
|---|---|---|---|---|---|---|
| vinyl-containing polyphenylene ether resin | SA9000 | 100 | 100 | | | 100 |
| | OPE-2st(1200) | | | | | |
| | OPE-2st(2200) | | | | | |
| maleimide resin | DE-TDAB | | | | | |
| | BMI-1000 | | | | | |
| | MIR-3000 | | | | | |
| | BMI-70 | | | 100 | 50 | |
| | BMI-2300 | | | | | |
| | BMI-1500 | | | | | |
| | BMI-1700 | | | | | |
| | BMI-3000 | | | | | |
| | BMI-80 | | | | 50 | |
| | Homide801 | | | | | |
| | 5G 001s | | | | | |
| first filler | ABN-020 | 20 | 20 | | 20 | 20 |
| | AlN | | | | | |
| | BN | | | | | |
| second filler | $TiO_2$ | 150 | 300 | 220 | | |
| | $SrTiO_3$ | | | | | |
| | $BaTiO_3$ | | | | | |
| other filler | $Al_2O_3$ | | | | | |
| crosslinking agent | TAIC | 40 | 40 | 40 | 40 | 40 |
| | Ricon 100 | 20 | 20 | 20 | 20 | 20 |
| curing accelerator | 25B | 1 | 1 | 1 | 1 | 1 |
| solvent mixture | MEK:toluene = 1:1 | 90 | 90 | 90 | 90 | 90 |

| Property | Unit | C7 | C8 | C9 | C10 | C11 |
|---|---|---|---|---|---|---|
| copper foil peeling strength | lb/in | 3.67 | 3.35 | 4.27 | 3.98 | 4.05 |
| breakdown voltage | kV | 30.0 | 43.0 | 37.0 | 29.0 | 30.0 |
| dissipation factor | — | 0.0067 | 0.0069 | 0.0065 | 0.0055 | 0.0055 |
| dielectric constant | — | 6.2 | 8.2 | 7.1 | 4.9 | 3.8 |
| thermal conductivity | W/(m · K) | 0.88 | 0.96 | 0.61 | 0.81 | 0.81 |

Samples (specimens) for the properties measured above were prepared as described below and tested and analyzed under specified conditions below.

1. Prepreg: Resin composition from each Example (listed in Table 1 and Table 2) or each Comparative Example (listed in Table 3 and Table 4) was respectively well-mixed to form a varnish, in which the dissolvable solid state chemical reagents were all dissolved. Then the varnish was loaded to an impregnation tank, and a fiberglass fabric (e.g., 1080 E-glass fiber fabric, available from Asahi) was impregnated into the impregnation tank to adhere the resin composition onto the fiberglass fabric, followed by heating at 130° C. to 170° C. to the semi-cured state (B-stage) to obtain a prepreg. Each prepreg made from the 1080 E-glass fiber fabric has a resin content of about 70%.
2. Copper-containing laminate 1 (i.e., copper-clad laminate 1, formed by lamination of two prepregs): Two 18 μm RTF copper foils (reverse treated copper foils) and two prepregs obtained from 1080 E-glass fiber fabrics impregnated with each Example or Comparative Example and having a resin content of about 70% were prepared and stacked in the order of one copper foil, two prepregs and one copper foil, followed by lamination under vacuum at 30 kg/cm² to 40 kg/cm² pressure and 190° C. to 210° C. for 90 to 120 minutes to form a copper-containing laminate 1. Insulation layers were formed by laminating to cure the two sheets of prepreg between the two copper foils, and the resin content of the insulation layers is about 70%.
3. Copper-containing laminate 2 (i.e., copper-clad laminate 2, formed by lamination of six prepregs): Two 18 μm RTF copper foils (reverse treated copper foils) and six prepregs obtained from 1080 E-glass fiber fabrics impregnated with each Example or Comparative Example and having a resin content of about 70% were prepared and stacked in the order of one copper foil, six prepregs and one copper foil, followed by lamination under vacuum at 30 kg/cm² to 40 kg/cm² pressure and 190° C. to 210° C. for 90 to 120 minutes to form a copper-containing laminate 2. Insulation layers were formed by laminating to cure the six sheets of prepreg between the two copper foils, and the resin content of the insulation layers is about 70%.
4. Copper-containing laminate 3 (i.e., copper-clad laminate 3, formed by lamination of eight prepregs): Two 18 μm RTF copper foils (reverse treated copper foils) and eight prepregs obtained from 1080 E-glass fiber fabrics impregnated with each Example or Comparative Example and having a resin content of about 70% were prepared and stacked in the order of one copper foil, eight prepregs and one copper foil, followed by lamination under vacuum at kg/cm² to 40 kg/cm² pressure and 190° C. to 210° C. for 90 to 120 minutes to form a copper-containing laminate 3. Insulation layers were formed by laminating eight sheets of prepreg between the two copper foils, and the resin content of the insulation layers is about 70%.
5. Copper-free laminate 1 (formed by lamination of two prepregs): Each copper-containing laminate 1 was etched to remove the two copper foils to obtain a copper-free laminate 1 made from laminating two prepregs and having a resin content of about 70%.

6. Copper-free laminate 2 (formed by lamination of eight prepregs): Each copper-containing laminate 3 was etched to remove the two copper foils to obtain a copper-free laminate 2 made from laminating eight prepregs and having a resin content of about 70%.

For each sample, test items and test methods are described below.

Copper foil peeling strength (0.5 ounce, Hoz peeling strength, Hoz P/S)

The aforesaid copper-containing laminate 2 (obtained by laminating six prepregs) was cut into a rectangular sample with a width of 24 mm and a length of greater than 60 mm, which was etched to remove surface copper foil to leave a rectangular copper foil with a width of 3.18 mm and a length of greater than 60 mm, and tested by using a tensile strength tester by reference to IPC-TM-650 2.4.8 at room temperature (about 25° C.) to measure the force (lb/in) required to separate the 0.5 ounce copper foil from the insulation layer of the laminate. In the technical field to which the present disclosure pertains, higher copper foil peeling strength is better. Under a 10 GHz frequency, for a copper-clad laminate with a Df value of between 0.0040 and 0.0080, a difference in copper foil peeling strength of greater than or equal to 0.5 lb/in represents a substantial difference in copper foil peeling strength of different laminates.

Breakdown Voltage (BDV)

The aforesaid copper-free laminate 2 sample (obtained by laminating eight prepregs) with a size of 75 mm*50 mm*1.6 mm was tested by reference to IPC-TM-650 2.5.6.3. The sample was immersed in insulating oil (i.e., transformer oil, available from Sinopec Lubricant Co., Ltd.), and the voltage was applied to the sample from 0V at an increase rate of 500V per second by the test apparatus; the voltage value was record when the leakage current was greater than 5 mA to represent the breakdown voltage. The unit of the breakdown voltage is volt (abbreviated as "V"). Generally, a difference in BDV value of less than 1 kV represents no substantial difference (i.e., no significant technical difficulty) in breakdown voltage of different laminates, and a difference in BDV value of greater than or equal to 1 kV represents a substantial difference (i.e., significant technical difficulty) in breakdown voltage of different laminates.

Dissipation Factor (Df)

The aforesaid copper-free laminate 1 (obtained by laminating two prepregs, having a resin content of about 70%) was subject to dissipation factor measurement. Each sample was tested by using a microwave dielectrometer (available from AET Corp.) by reference to JIS C2565 at room temperature (about 25° C.) and under a 10 GHz frequency to obtain the dissipation factor. Lower dissipation factor represents better dielectric properties of the sample. Under a 10 GHz frequency, for a Df value of between 0.0040 and 0.0080, a difference in Df of less than 0.0005 represents no substantial difference (i.e., no significant technical difficulty) in dissipation factor in different laminates, and a difference in Df of greater than or equal to 0.0005 represents a significant difference (i.e., significant technical difficulty) in dissipation factor in different laminates.

Dielectric Constant (Dk)

The aforesaid copper-free laminate 1 (obtained by laminating two prepregs, resin content of about 70%) was subject to dielectric constant measurement. Each sample was measured by using a microwave dielectrometer (available from AET Corp.) by reference to JIS C2565 at room temperature (about 25° C.) and under a 10 GHz frequency. Under a 10 GHz frequency, for a high Dk material, a difference in Dk of less than 0.5 represents no substantial difference (i.e., no significant technical difficulty) in dielectric constant in different laminates, and a difference in Dk of greater than or equal to 0.5 represents a significant difference (i.e., significant technical difficulty) in dielectric constant in different laminates.

Thermal Conductivity (Tk)

The aforesaid copper-free laminate 2 sample (obtained by laminating eight prepregs) with a size of 31 mm*31 mm*0.85 mm was tested by reference to the processes described in ASTM-D5470. The sample was heated by the test apparatus from room temperature (about 25° C.), and after 30 minutes of heating when the temperature was 80° C., a thermal conductivity measurement instrument (model No. LW-9091 ir, available from Long Win Science and Technology Corporation) was used to calculate and analyze to obtain the thermal conductivity. The unit of thermal conductivity is W/(m·K). In the technical field to which the present disclosure pertains, a difference in Tk of less than 0.1 W/(m·K) represents no substantial difference (i.e., no significant technical difficulty) in thermal conductivity in different laminates, and a difference in Tk of greater than or equal to 0.1 W/(m·K) represents a significant difference (i.e., significant technical difficulty) in thermal conductivity in different laminates.

The following observations can be made according to the test results above.

Resin compositions contain all of 100 parts by weight of a thermosetting resin, 15 parts by weight to 50 parts by weight of a sintered body formed by aluminum nitride and boron nitride and 180 parts by weight to 280 parts by weight of titanium dioxide as described herein, such as Examples E1 to E16, can achieve at the same time desirable properties including a copper foil peeling strength of greater than or equal to 4.03 lb/in, a breakdown voltage of greater than or equal to 35.5 kV, and a dissipation factor of less than or equal to 0.0049.

In contrast to Examples E1 to E16, Comparative Examples C1, C2 and C9 not containing the sintered body formed by aluminum nitride and boron nitride as used herein and Comparative Examples C3, C4, C10 and $C_{11}$ not containing titanium dioxide fail to achieve all of the desirable properties described above.

In contrast to Examples E1 to E16, if the amount of the sintered body formed by aluminum nitride and boron nitride in the resin composition is not within the range of 15 parts by weight to 50 parts by weight, such as Comparative Examples C5 and C6, at least one properties of copper foil peeling strength, breakdown voltage and dissipation factor can not be improved.

In contrast to Examples E1 to E16, if the amount of titanium dioxide in the resin composition is not within the range of 180 parts by weight to 280 parts by weight, such as Comparative Examples C7 and C8, at least one properties of copper foil peeling strength, breakdown voltage and dissipation factor can not be improved.

Overall, the resin composition of the present disclosure can achieve at the same time a copper foil peeling strength of greater than or equal to 4.03 lb/in, a breakdown voltage of greater than or equal to 35.5 kV, a dissipation factor of less than or equal to 0.0049, a dielectric constant of greater than or equal to 6.9, and a thermal conductivity of greater than or equal to 0.61 W/(m·K).

The above detailed description is merely illustrative in nature and is not intended to limit the embodiments of the subject matter or the application and use of such embodiments. As used herein, the term "exemplary" means "serving as an example, instance, or illustration." Any implementation described herein as exemplary is not necessarily to be construed as preferred or advantageous over other implementations.

Moreover, while at least one exemplary example or comparative example has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, various changes can be made in the function and arrangement of elements without departing from the scope defined by the claims, which include known equivalents and foreseeable equivalents at the time of filing this patent application.

What is claimed is:

1. A resin composition, comprising:
   (A) 100 parts by weight of a thermosetting resin, which comprises a vinyl-containing polyphenylene ether resin, a maleimide resin, or a combination thereof; and
   (B) a filler at least comprising a sintered body formed by aluminum nitride and boron nitride and titanium dioxide, wherein the sintered body formed by aluminum nitride and boron nitride is 15 parts by weight to 50 parts by weight relative to 100 parts by weight of the thermosetting resin, and wherein the titanium dioxide is 180 parts by weight to 280 parts by weight relative to 100 parts by weight of the thermosetting resin.

2. The resin composition of claim 1, wherein the vinyl-containing polyphenylene ether resin comprises a vinylbenzyl-containing biphenyl polyphenylene ether resin, a methacrylate-containing polyphenylene ether resin, a vinylbenzyl-containing bisphenol A polyphenylene ether resin, a chain-extended vinyl-containing polyphenylene ether resin, or a combination thereof.

3. The resin composition of claim 1, wherein the maleimide resin comprises diethyl bismaleimidotoluene, 4,4'-diphenylmethane bismaleimide, biphenyl maleimide, polyphenylmethane maleimide, bisphenol A diphenyl ether bismaleimide, 3,3'-dimethyl-5,5'-diethyl-4,4'-diphenyl methane bismaleimide, a maleimide resin containing an aliphatic long-chain structure, a prepolymer of 4,4'-diphenylmethane bismaleimide and diallyl bisphenol A, a vinyl cyclopentadiene-modified maleimide, or a combination thereof.

4. The resin composition of claim 1, wherein the filler further comprises 5 parts by weight to 20 parts by weight of aluminium oxide relative to 100 parts by weight of the thermosetting resin.

5. The resin composition of claim 1, further comprising flame retardant, crosslinking agent, curing accelerator, polymerization inhibitor, solvent, silane coupling agent, coloring agent, toughening agent, core-shell rubber, or a combination thereof.

6. An article made from the resin composition of claim 1, comprising a prepreg, a resin film, a laminate or a printed circuit board.

7. The article of claim 6, having a copper foil peeling strength as measured by reference to IPC-TM-650 2.4.8 of greater than or equal to 4.03 lb/in.

8. The article of claim 6, having a breakdown voltage as measured by reference to IPC-TM-650 2.5.6.3 of greater than or equal to 35.5 kV.

9. The article of claim 6, having a dissipation factor at 10 GHz as measured by reference to JIS C2565 of less than or equal to 0.0049.

* * * * *